(12) United States Patent
Tan et al.

(10) Patent No.: US 11,662,066 B2
(45) Date of Patent: May 30, 2023

(54) OPTOELECTRONIC DEVICE WITH LIGHT-EMITTING DIODES

(71) Applicant: Aledia, Grenoble (FR)

(72) Inventors: Wei Sin Tan, Meylan (FR); Philippe Gilet, Teche (FR)

(73) Assignee: Aledia, Grenoble (FR)

( * ) Notice: Subject to any disclaimer, the term of this patent is extended or adjusted under 35 U.S.C. 154(b) by 27 days.

(21) Appl. No.: 16/474,004

(22) PCT Filed: Dec. 28, 2017

(86) PCT No.: PCT/EP2017/084780
§ 371 (c)(1),
(2) Date: Jun. 26, 2019

(87) PCT Pub. No.: WO2018/122357
PCT Pub. Date: Jul. 5, 2018

(65) Prior Publication Data
US 2020/0300422 A1 Sep. 24, 2020

(30) Foreign Application Priority Data

Dec. 29, 2016 (FR) ..................... 1663500

(51) Int. Cl.
*F21K 9/64* (2016.01)
*F21K 9/68* (2016.01)
(Continued)

(52) U.S. Cl.
CPC ............... *F21K 9/64* (2016.08); *F21K 9/68* (2016.08); *F21K 9/90* (2013.01); *F21V 13/14* (2013.01);
(Continued)

(58) Field of Classification Search
None
See application file for complete search history.

(56) References Cited

U.S. PATENT DOCUMENTS 7,385,262 B2 * 6/2008 O'Keeffe ............ H01L 51/0508
977/749
8,455,903 B2 * 6/2013 Leatherdale .......... H01L 27/156
257/98
(Continued)

FOREIGN PATENT DOCUMENTS

EP   2 750 208 A2   7/2014
EP   3 024 030 A1   5/2019
(Continued)

OTHER PUBLICATIONS

Final Rejection of U.S. Appl. No. 16/626,277, filed Nov. 19, 2021 (Year: 2021).*
(Continued)

*Primary Examiner* — Telly D Green
(74) *Attorney, Agent, or Firm* — Wolf, Greenfield & Sacks, P.C.

(57) ABSTRACT

An optoelectronic device including light-emitting components, each light-emitting component being adapted to emit a first radiation at a first wavelength, and photoluminescent blocks, each photoluminescent block facing at least one light-emitting component and comprising a single quantum well or multiple quantum wells, photoluminescent blocks being divided into first photoluminescent blocks adapted to convert by optical pumping the first radiation into a second radiation at a second wavelength, second photoluminescent blocks adapted to convert by optical pumping the first radiation into a third radiation at a third wavelength and third photoluminescent blocks adapted to convert by optical pumping the first radiation into a fourth radiation at a fourth wavelength.

18 Claims, 5 Drawing Sheets

(51) Int. Cl.

| | | |
|---|---|---|
| *F21K 9/90* | (2016.01) | |
| *F21V 13/14* | (2006.01) | |
| *H01L 25/075* | (2006.01) | |
| *F21Y 115/30* | (2016.01) | |
| *F21Y 113/13* | (2016.01) | |
| *F21Y 115/10* | (2016.01) | |
| *H01L 33/32* | (2010.01) | |
| *H01L 33/48* | (2010.01) | |
| *F21Y 105/16* | (2016.01) | |

(52) U.S. Cl.
CPC .......... H01L 25/0753 (2013.01); H01L 33/32 (2013.01); H01L 33/483 (2013.01); *F21Y 2105/16* (2016.08); *F21Y 2113/13* (2016.08); *F21Y 2115/10* (2016.08); *F21Y 2115/30* (2016.08)

(56) References Cited

U.S. PATENT DOCUMENTS

| | | | | |
|---|---|---|---|---|
| 9,711,694 | B2 * | 7/2017 | Robin | H01L 33/502 |
| 10,377,643 | B1 * | 8/2019 | Collins | C02F 1/725 |
| 10,916,579 | B2 * | 2/2021 | Tan | H01L 33/08 |
| 2005/0098788 | A1 * | 5/2005 | Plass | H01S 5/18311 |
| | | | | 257/95 |
| 2007/0025673 | A1 * | 2/2007 | Bose | B82Y 20/00 |
| | | | | 385/129 |
| 2008/0036038 | A1 * | 2/2008 | Hersee | B82Y 10/00 |
| | | | | 438/479 |
| 2008/0178924 | A1 * | 7/2008 | Kempa | B82Y 10/00 |
| | | | | 257/E31.043 |
| 2010/0090198 | A1 * | 4/2010 | Li | H01L 31/0352 |
| | | | | 257/E31.093 |
| 2010/0124246 | A1 * | 5/2010 | Lutgen | H01L 33/0095 |
| | | | | 372/50.1 |
| 2010/0276664 | A1 * | 11/2010 | Hersee | H01L 21/02458 |
| | | | | 257/15 |
| 2010/0315012 | A1 | 12/2010 | Kim et al. | |
| 2011/0064102 | A1 * | 3/2011 | Raring | B82Y 20/00 |
| | | | | 372/44.011 |
| 2011/0253982 | A1 * | 10/2011 | Wang | H01L 29/88 |
| | | | | 257/14 |
| 2011/0297975 | A1 * | 12/2011 | Yeh | H04N 9/315 |
| | | | | 257/88 |
| 2012/0032142 | A1 * | 2/2012 | Leatherdale | H01L 27/156 |
| | | | | 257/13 |
| 2012/0077680 | A1 * | 3/2012 | Berggren | G01J 1/42 |
| | | | | 427/63 |
| 2012/0256161 | A1 * | 10/2012 | Sabathil | H01L 25/0756 |
| | | | | 257/13 |
| 2013/0141013 | A1 | 6/2013 | Kodama et al. | |
| 2013/0256689 | A1 * | 10/2013 | Pougeoise | B82Y 20/00 |
| | | | | 438/93 |
| 2014/0294024 | A1 * | 10/2014 | Kim | H01L 29/78 |
| | | | | 372/20 |
| 2015/0102366 | A1 | 4/2015 | Wada | |
| 2016/0141469 | A1 * | 5/2016 | Robin | H01L 33/505 |
| | | | | 257/88 |
| 2016/0355412 | A1 * | 12/2016 | Collins | C02F 1/325 |
| 2017/0010736 | A1 * | 1/2017 | Iwata | H01B 1/22 |
| 2020/0119233 | A1 * | 4/2020 | Dupont | G02B 1/005 |

FOREIGN PATENT DOCUMENTS

| | | | | |
|---|---|---|---|---|
| TW | I220319 B | * | 8/2011 | ............ H01L 33/20 |
| WO | WO 2007/007954 A1 | | 1/2007 | |
| WO | WO-2010062644 A2 | * | 6/2010 | ............ B82Y 10/00 |
| WO | WO 2010/123814 A1 | | 10/2010 | |
| WO | WO 2011/008476 A1 | | 1/2011 | |
| WO | WO-2012035243 A1 | * | 3/2012 | ........... H01L 27/153 |

OTHER PUBLICATIONS

International Search Report and Written Opinion for International Application No. PCT/EP2017/084780, dated Mar. 27, 2018.
International Preliminary Report on Patentability for International Application No. PCT/EP2017/084780, dated Jul. 11, 2019.

\* cited by examiner

OPTOELECTRONIC DEVICE WITH LIGHT-EMITTING DIODES

This application is a national stage filing under 35 U.S.C. § 371 of International Patent Application Serial No. PCT/EP2017/084780, filed Dec. 28, 2017, which claims priority to French patent application FR16/63500, filed Dec. 29, 2016. The entire contents of these applications are incorporated herein by reference in their entireties.

BACKGROUND

The present disclosure relates to an optoelectronic device, particularly a display screen or an image projection device, with light-emitting components, particularly light-emitting diodes, based on semiconductor materials and their manufacturing methods.

DISCUSSION OF THE RELATED ART

A pixel of an image corresponds to the unit element of the image displayed by the optoelectronic device. When the optoelectronic device is a color image display optoelectronic device, it generally comprises for the display of each pixel of the image at least three components, also called display sub-pixels, which each emit a light radiation substantially in a single color (for example, red, green, and blue). The superposing of the radiations emitted by the three display sub-pixels provides the observer with the color sensation corresponding to the pixel of the displayed image. In this case, the assembly formed by the three sub-display pixels used to display a pixel of an image is called display pixel of the optoelectronic device.

There exist optoelectronic devices comprising light-emitting diodes based on semiconductor materials, each diode comprising a stack of semiconductor layers for example comprising at least one group-III element and one group-V element, called III-V compound hereafter, particularly gallium nitride (GaN).

However, known light-emitting diodes comprising a stack of semiconductor layers, for example comprising a III-V compound, and emitting a red light show poor internal quantum efficiency (IQE) for conventional III-N based structures.

Blocks of photoluminescent materials may be formed on at least some of the light-emitting diodes. Each photoluminescent block is adapted to convert the radiation emitted by the associated light-emitting diode into a desired radiation. Known photoluminescent blocks comprise micrometer-range photoluminescent particles or quantum dots. However, known materials used to form micrometer-range photoluminescent particles show poor internal quantum efficiency. Moreover, quantum dots show reduced lifetime.

SUMMARY

An object of an embodiment aims at overcoming all or part of the disadvantages of the previously-described optoelectronic devices comprising light-emitting diodes.

Another object of an embodiment is that the internal quantum efficiency of the photoluminescent blocks is increased.

Another object of an embodiment is that the lifetime of the photoluminescent blocks is increased.

Another object of an embodiment is that the light-emitting diodes comprise a stack of semiconductor layers, for example mainly comprising a III-V compound.

Another object of an embodiment is that all the light-emitting diodes of the optoelectronic device show high internal quantum efficiency.

Another object of an embodiment is that the photoluminescent blocks of the optoelectronic device show high internal quantum efficiency.

Thus, an embodiment provides an optoelectronic device comprising:

light-emitting components, each light-emitting component being adapted to emit a first radiation at a first wavelength; and photoluminescent blocks, each photoluminescent block facing at least one light-emitting component and comprising a single quantum well or multiple quantum wells, photoluminescent blocks being divided into first photoluminescent blocks adapted to convert by optical pumping the first radiation into a second radiation at a second wavelength, second photoluminescent blocks adapted to convert by optical pumping the first radiation into a third radiation at a third wavelength and third photoluminescent blocks adapted to convert by optical pumping the first radiation into a fourth radiation at a fourth wavelength.

According to an embodiment, the optoelectronic device further comprises walls at least partially made of a reflecting material at least for the second, third and fourth radiations, said walls delimiting openings, said openings being opposite to the light-emitting components, each opening comprising at least one of the photoluminescent blocks.

According to an embodiment, the optoelectronic device further comprises a full sheet non-patterned filter covering the photoluminescent blocks on the side of the photoluminescent blocks opposite to the light-emitting components and adapted to block the first radiation and to give way to the second, third and fourth radiations.

According to an embodiment, the light-emitting components comprise light-emitting diodes.

According to an embodiment, the light-emitting components comprise vertical-cavity surface-emitting lasers.

According to an embodiment, the first wavelength is in the range from 350 nm to 430 nm, the second wavelength is in the range from 440 nm to 490 nm, the third wavelength is in the range from 510 nm to 570 nm and the fourth wavelength is in a range from 600 nm to 720 nm.

According to an embodiment, the photoluminescent blocks further comprise fourth photoluminescent blocks adapted to convert by optical pumping the first radiation into a fifth radiation at a fifth wavelength.

According to an embodiment, the fifth wavelength is in the range from 570 nm to 600 nm.

According to an embodiment, the photoluminescent blocks are bounded to the light-emitting components by a bonding medium transparent to the first radiation.

According to an embodiment, the walls surround the light-emitting components.

Another embodiment provides a method of manufacturing the previously disclosed optoelectronic device, comprising the steps of:

a) providing a first substrate;

b) forming the light-emitting components on the first substrate;

c) forming the photoluminescent blocks on a second substrate; and d) binding the photoluminescent blocks to the light-emitting components.

According to an embodiment, the method further comprises the step of:

e) forming a full-sheet non patterned filter above the photoluminescent blocks adapted to block the first radiation.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
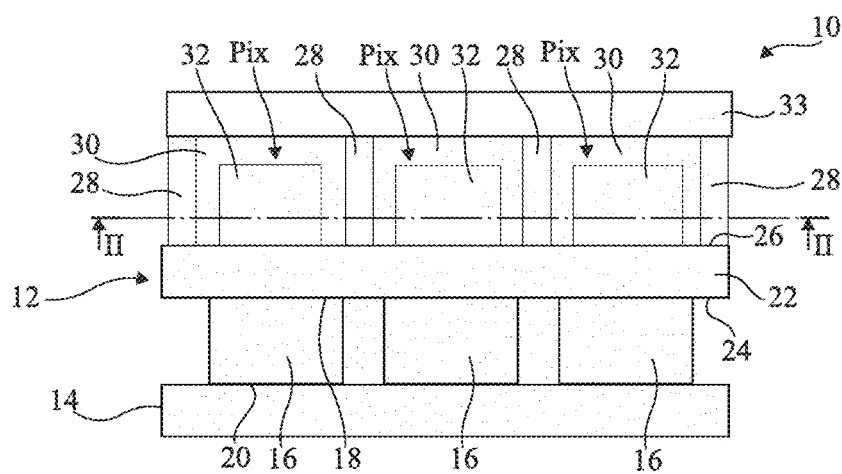
FIGS. 1 and 2 are cross-section views in orthogonal planes of an embodiment of an optoelectronic device.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for biasing a light-emitting diode of an optoelectronic device are well known and will not be described.

In the following description, unless otherwise indicated, terms "substantially", "approximately", and "in the order of" mean "to within 10%". Moreover, "active area" of a light-emitting diode designates the region of the light-emitting diode from which most of the electromagnetic radiation provided by the light-emitting diode is emitted. Further, when a first element is said to be linked to a second element by an epitaxial relationship, this means that the first element is made from a first layer and the second element is made from a second layer that is grown by epitaxy on the first layer or inversely.

Term "microwire" or "nanowire" designates a three-dimensional structure of elongated shape along a preferred direction, having at least two dimensions, called minor dimensions, in the range from 5 nm to 2.5 µm, preferably from 50 nm to 2.5 µm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 µm, preferably in the range from 100 nm to 1 µm, more preferably from 100 nm to 800 nm. In certain embodiments, the height of each microwire or nanowire may be greater than or equal to 500 nm, preferably in the range from 1 µm to 50 µm.

The cross-section of the wires may have different shapes, such as, for example, an oval, circular, or polygonal shape, particularly triangular, rectangular, square, or hexagonal. It should thus be understood that term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter.

Figure 2:
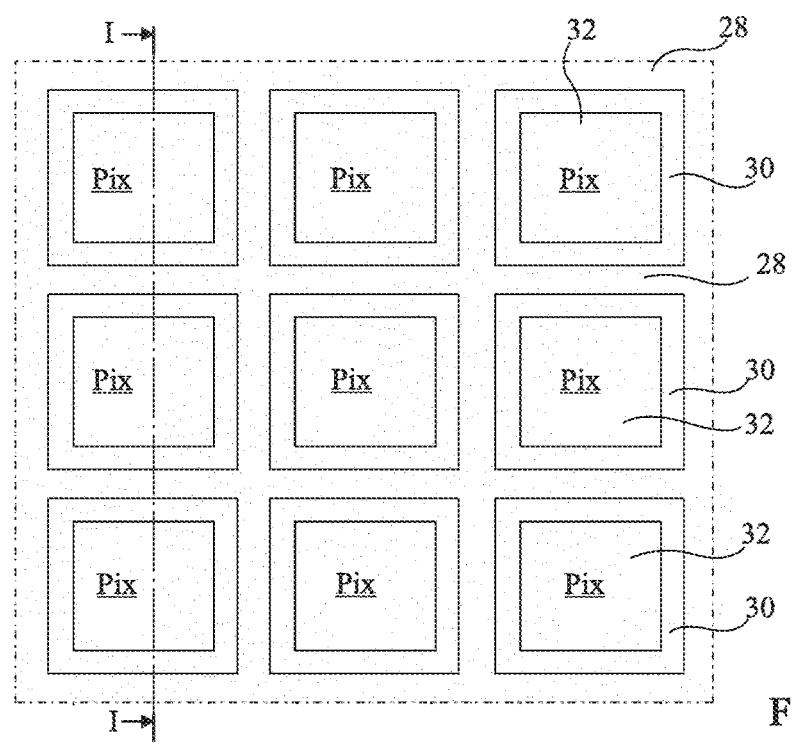

FIGS. 1 and 2 show an embodiment of an optoelectronic device 10, for example corresponding to a display screen or to an image projection device.

Device 10 comprises two integrated circuits 12, 14. First integrated circuit 12 comprises light-emitting components 16, for example light-emitting diodes, and is called optoelectronic circuit or optoelectronic chip in the following description. Second integrated circuit 14 comprises electronic components, not shown, especially transistors, used to control light-emitting diodes 16 of first integrated circuit 12. Second integrated circuit 14 is called control circuit or control chip in the following description. Optoelectronic circuit 12 is bonded to control circuit 14. According to the bonding type, bounding pads, not shown, may be present between optoelectronic chip 12 and control chip 14. In an embodiment, a light-emitting component 16 is provided for each display subpixel Pix of electronic device 10. Each light-emitting components 16 comprises two opposite faces 18, 20, faces 20 of light-emitting components 16 being bounded to control circuit 14. Preferably all light-emitting components 16 have the same structure.

Optoelectronic circuit 12 also comprises a substrate 22 covering light-emitting components 16 on the opposite side to control circuit 14. Substrate 22 has opposite faces 24, 26, face being in contact with light-emitting components 16. Optoelectronic circuit 12 also comprises walls 28 on substrate 22. Walls 28 delimit openings 30 that expose parts of face 26. In an embodiment, each opening 30 is opposite to a light-emitting component 16. According to an embodiment, walls 28 form a grid and openings 30 are arranged in rows and columns. As an example, nine subpixels Pix are shown in FIG. 2. Openings 30 have a square shape in FIG. 2. However, the shape of openings 30 may be different.

Optoelectronic circuit 12 also comprises photoluminescent blocks 32 which are located in at least some of the openings 30, preferably in contact with face 26. Preferably, there is a photoluminescent block 32 in each opening 30. Each photoluminescent block 32 comprises a stack of semiconductor layers.

In an embodiment, all light-emitting diodes 16 emit light at a first wavelength. In an embodiment, optoelectronic circuit 12 comprises at least three types of photoluminescent blocks 32. For each pixel of the image to be displayed, optoelectronic circuit 12 comprises subpixels with photoluminescent blocks 32 of the three types. Photoluminescent blocks 32 of the first type are adapted to convert the radiation at the first wavelength into a radiation at a second wavelength by optical pumping. Photoluminescent blocks 32 of the second type are adapted to convert the radiation at the first wavelength into a radiation at a third wavelength by optical pumping. Photoluminescent blocks 32 of the third type are adapted to convert the radiation at the first wavelength into a radiation at a fourth wavelength by optical pumping. In an embodiment, first, second, third and fourth wavelengths are different. In an embodiment, the first wavelength corresponds to ultraviolet radiation, and is in the range from 350 nm to 430 nm. In an embodiment, the second wavelength corresponds to blue light and is in the range from 440 nm to 490 nm. In an embodiment, the third wavelength corresponds to green light and is in the range from 510 nm to 570 nm. In an embodiment, the fourth wavelength corresponds to red light and is in a range from 600 nm to 720 nm.

In an embodiment, optoelectronic circuit 12 comprises photoluminescent blocks 32 of a fourth type. Photoluminescent blocks 32 of the fourth type are adapted to convert the radiation at the first wavelength into a radiation at a fifth wavelength by optical pumping. In an embodiment, fifth wavelength corresponds to yellow light and is in a range from 570 nm to 600 nm. In an embodiment, first, second, third, fourth and fifth wavelengths are different. For each pixel of the image to be displayed, optoelectronic circuit 12 comprises subpixels with photoluminescent blocks 32 of the four types.

Optoelectronic circuit 12 also comprises a filter 33 which rests on walls 28. Filter 33 is adapted to block the radiation emitted from light-emitting components 16 and which has not been converted by photoluminescent blocks 32. Filter 33 is adapted to give way to the radiations emitted by photoluminescent blocks 32. The full sheet filter is non-patterned for ease of device fabrication, thus reducing manufacturing cost. A filling material may be present in openings 30 between walls 28, photoluminescent blocks 32 and filter 33.

In an embodiment, substrate 22 is made of an electrically conductive material and each light-emitting diode 16 comprises an electrically conductive element 42 running along the lateral side of light-emitting diode 16 and in contact with control circuit 14 and with substrate 22. Conductive element 42 is electrically insulated from light-emitting diode 16 by an electrically insulating layer 44. However, conductive elements 42 and insulating layers 44 may not be present.

Figure 3:
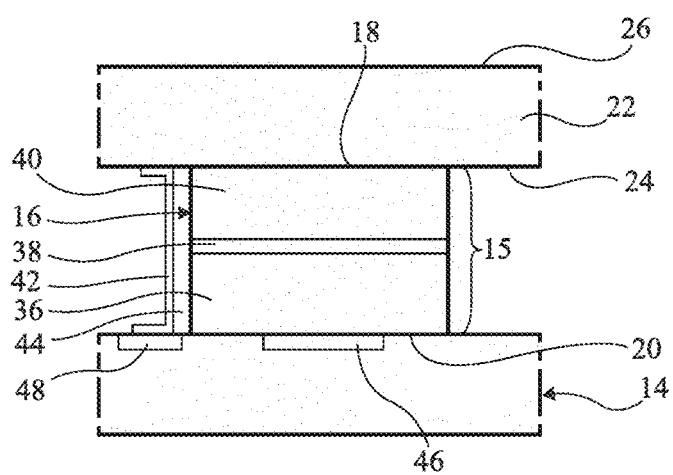
FIGS. 3 and 4 are partial simplified cross-section views of embodiments of a light-emitting component of the optoelectronic device shown in FIG. 1.

FIG. 3 shows an embodiment of light-emitting diode 16 formed by a stack 35 of semiconductor layers. Stack 35 comprises, from bottom to top in FIG. 4:

a doped semiconductor layer 36 of a first conductivity type, for example, P-type doped, and delimiting face 20;

an active area 38; and a doped semiconductor layer 40 of a second conductivity type opposite to the first conductivity type, for example, N-type doped, and delimiting face 18.

Figure 4:
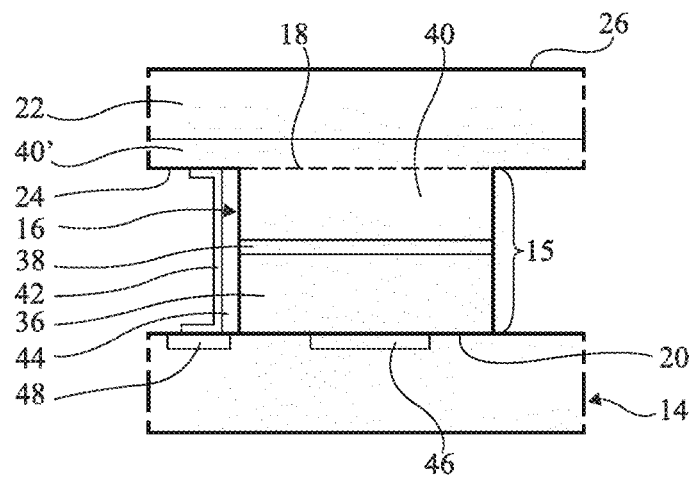

FIG. 4 shows another embodiment of light-emitting diode 16 comprising all the elements shown in FIG. 3 with the difference that substrate 20 comprises a doped semiconductor layer 40' of the second conductivity type delimiting face 24. Semiconductor layer 40' is made of the same material as semiconductor layers 40 of light-emitting diodes 16 and forms a structurally continuous medium with semiconductor layers 40. Semiconductor layer 40' improves current spreading into semiconductor layers 40 of light-emitting diodes 16.

Figure 5:
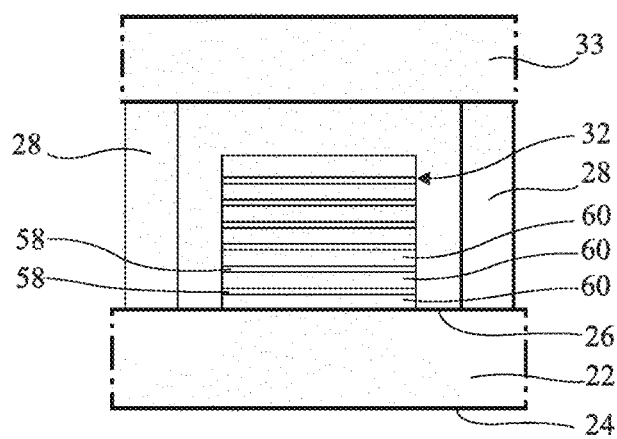
FIG. 5 is a partial simplified cross-section view of an embodiment of a photoluminescent block of the optoelectronic device shown in FIG. 1.

FIG. 5 shows an embodiment of photoluminescent block 32 formed by a stack of semiconductor layers. Photoluminescent block 32 can be formed on substrate 22 by means of bonding via an optically transparent medium. Photoluminescent block 32 may comprise confinement means. Photoluminescent block 32 may comprise a single quantum well or multiple quantum wells. Photoluminescent block 32 may also comprise a buffer layer or a substrate in order to provide mechanical support to the structure. When photoluminescent block 32 comprises a single quantum well, it may comprise an active semiconductor layer in sandwich between first and second semiconductor layers. Active semiconductor layer is made of a semiconductor material different from the semiconductor material forming first and second layers and having a bandgap smaller than that of first and second layers. As it is shown in FIG. 5, photoluminescent block 32 may comprise multiple quantum wells. It then comprises a stack of semiconductor layers forming an alternation of quantum wells 58 and of barrier layers 60. The materials of the layers of photoluminescent block 32 depend on the desired wavelength of the radiation emitted by photoluminescent block 32 and the wavelength of the radiation received by photoluminescent block 32. Photoluminescent blocks with an internal quantum efficiency higher than 50% may be obtained. Moreover, photoluminescent blocks with a long lifespan may be obtained.

In an embodiment, for light-emitting diodes 16 emitting radiation at the first wavelength of 350 nm to 430 nm, photoluminescent blocks 32 emitting a radiation at the second wavelength of 450 nm may be formed of an alternation of GaN and InGaN layers having respective thicknesses from 3 nm to 30 nm (for example, 6 nm) and from 1 nm to 30 nm (for example, 2.5 nm), InGaN layers having a proportion of 17%±5% of In.

In an embodiment, for light-emitting diodes 16 emitting radiation at the first wavelength of 350 nm to 430 nm, photoluminescent blocks 32 emitting a radiation at the third wavelength of 530 nm may be formed of an alternation of GaN and InGaN layers having respective thicknesses from 3 nm to 30 nm (for example, 6 nm) and from 1 nm to 30 nm (for example, 2.5 nm), InGaN layers having a proportion of 28%±5% of In.

In an embodiment, for light-emitting diodes 16 emitting radiation at the first wavelength of 350 nm to 430 nm, photoluminescent blocks 32 emitting a radiation at the third wavelength of 630 nm may be formed of an alternation of (Al)InGaP and (Al)GaInP layers having respective thicknesses from 3 nm to 20 nm (for example, 6 nm) and from 1 nm to 30 nm (for example, 2.5 nm), AlInGaP layers having a proportion of 50%±10% of In and a proportion of 25%±5% of Al.

In an embodiment, for light-emitting diodes 16 emitting radiation at the first wavelength of 350 nm to 430 nm, photoluminescent blocks 32 emitting a radiation at the fourth wavelength of 630 nm may be formed of an alternation of GaN and InGaN layers having respective thicknesses from 3 nm to 30 nm (for example, 6 nm) and from 1 nm to 30 nm (for example, 2.5 nm), InGaN layers having a proportion of 40%±5% of In.

In an embodiment, for light-emitting diodes 16 emitting radiation at the first wavelength of 350 nm to 430 nm, photoluminescent blocks 32 emitting a radiation at the fifth wavelength of 580 nm may be formed of an alternation of GaN and InGaN layers having respective thicknesses from 3 nm to 30 nm (for example, 6 nm) and from 1 nm to 30 nm (for example, 2.5 nm), InGaN layers having a proportion of 32%±5% of In.

In operation, voltages are applied between conductive pads 46 and 48, so that, for each subpixel Pix, the active area of light-emitting diode 16 emits light with an intensity that depends on the voltage applied between conductive pads 46 and 48 associated with subpixel Pix. Photoluminescent block 32 converts at least part of the radiation emitted by associated light-emitting diode 16 into the desired radiation. Walls 28 reduce crosstalk between adjacent subpixels Pix. In an embodiment, all light-emitting diodes 16 emit at the same first wavelength. The non-patterned filter 33, which is adapted to block the radiation emitted from light-emitting components 16 and which has not been converted by photoluminescent blocks 32, advantageously covers all optoelectronic circuit 12.

Substrate 22 is substantially transparent to the radiation emitted by light-emitting diodes 16. Substrate 22 is in a material adapted to the formation of light-emitting diodes 16. Substrate 22 is for example a semiconductor substrate, such as a sapphire, silicon carbide, zinc oxide, glass or aluminum nitride, substrate. Faces 24, 26 may be planar and parallel.

Semiconductor layers 36, 40 and wires 52 are at least partly made of at least one semiconductor material. The semiconductor material may be silicon, germanium, silicon carbide, a III-V compound, a II-VI compound, or a combination of at least two of these compounds. The thickness of semiconductor layer 36 is in the range from 50 nm to 1 µm. The thickness of semiconductor layer 40 is in the range from 50 nm to 10 µm.

Semiconductor layers 36, 40 and wires 52 may be at least partly made of semiconductor materials mainly comprising a III-V compound, for example, a III-N compound or phosphide-based compound. Examples of group-III elements comprise gallium (Ga), indium (In), or aluminum (Al). Examples of III-N compounds are GaN, AlN, InN, InGaN, AlGaN, or AlInGaN. Examples of phosphide-based elements comprise aluminium (Al), gallium (Ga), indium (In) and phosphorus (P). Examples of phosphide-based compounds are AlInGaP, InGaP, GaP, or AlGaP. Other group-V elements may also be used, for example, phosphorus or arsenic. Generally, the elements in the III-V compound may be combined with different molar fractions.

Semiconductor layers 36 and 40 may be at least partly made of semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

Active area of light-emitting diode 16 is the layer having most of the radiation supplied by light-emitting diode 16 emitted therefrom. According to an example, the active area may comprise confinement means. Active area may comprise a single quantum well, multiple quantum wells or a double heterostructure. It may then comprise a semiconductor material different from the semiconductor material forming semiconductor layers 36 and 40 and having a bandgap smaller than that of semiconductor layers 36 and 40. Active area may comprise multiple quantum wells. It then comprises a stack of semiconductor layers forming an alternation of quantum wells and of barrier layers.

According to an embodiment, walls 28 may be made of a reflecting material or covered by a reflecting coating for the wavelengths of the radiations emitted by photoluminescent blocks 32. Walls 28 may be made of a conductive material, for example a metal such as aluminum, silver, copper, or zinc. The height of walls 28, measured in a direction orthogonal to face 26, is in the range from 1 µm to 200 µm, preferably from 5 µm to 30 µm. The thickness of walls 28, measured in a direction parallel to face 26, is in the range from 100 nm to 50 µm, preferably from 1 µm to 10 µm. In the view of FIG. 2, the area of opening 30 corresponds to the area of a square having a side ranging from 1 µm to 100 µm, preferably from 3 µm to 15 µm.

Conductive elements 42 are made of a conductive material, for example a metal such as aluminum, silver, copper, or zinc. Conductive elements 42 may be made of a transparent and conductive material such as graphene or a transparent conductive oxide (TCO), for example, indium tin oxide (ITO), gallium zinc oxide (GZO) or aluminum zinc oxide (AZO). As an example, conductive elements 42 have a thickness in the range from 5 nm to 1000 nm, preferably from 20 nm to 50 nm.

Insulating layers 44 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of aluminum oxide ($Al_2O_3$), of hafnium oxide ($HfO_2$), or of diamond.

The height of photoluminescent blocks 32, measured in a direction orthogonal to face 26, is in the range from 50 nm to 500 µm. The height of photoluminescent blocks 32 is preferably inferior to the height of walls 28.

The non-patterned filter 33 may have a multilayer structure. In an embodiment, for light-emitting diodes 16 emitting radiation at the first wavelength in the range of 350 nm to 430 nm, filter 33 may be a band pass filter allowing only wavelengths in the range of 440 nm to 720 nm.

Figure 6:
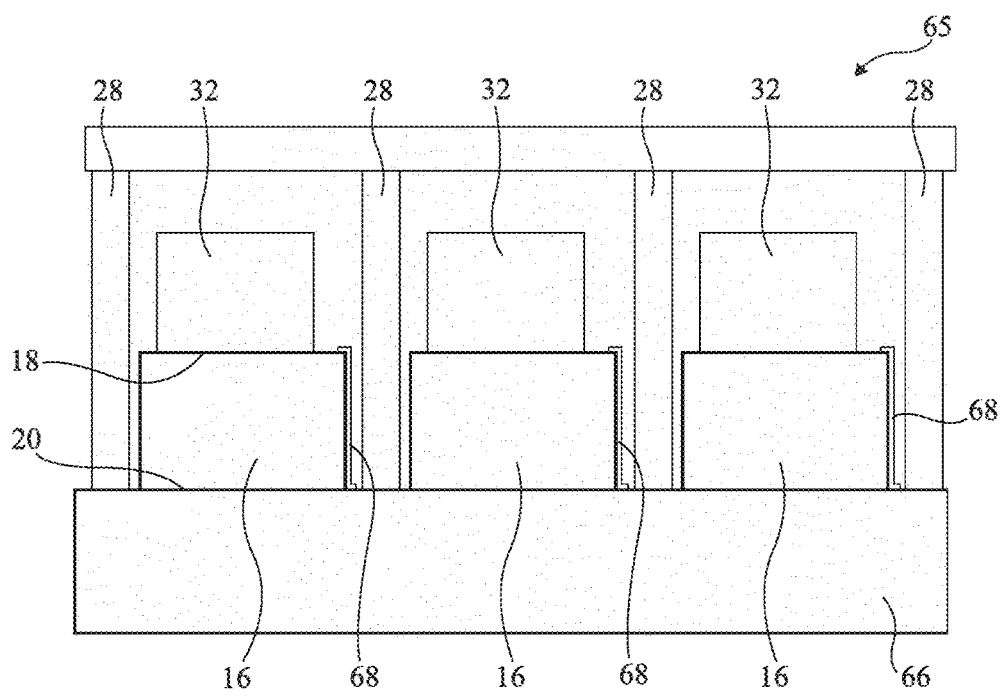
FIGS. 6 to 8 are partial simplified cross-section views of other embodiments of optoelectronic devices.

FIG. 6 is a partial simplified cross-section view of an embodiment of an optoelectronic device 65 comprising light-emitting components. Optoelectronic device 65 comprises the same elements as optoelectronic device 10 shown in FIG. 1 with the difference that control circuit 14 is replaced by a substrate 66 adapted for the formation of light-emitting components 16, in that photoluminescent blocks 32 directly rest on light-emitting components 16 and in that walls 28 rest on substrate 66 and surround both light-emitting components 16 and photoluminescent blocks 32. Photoluminescent blocks 32 can be attached to light emitting components 16 through bonding with an optically transparent medium. Optoelectronic device 65 further comprises, for each light-emitting component 16, an electrically conductive element 68 running along the lateral side of light-emitting component 16 and in contact with substrate 66 and with face 18 of the light-emitting component 16 and electrically insulated from the lateral side of light-emitting component 16 by an electrically insulating layer not shown. Conductive element 68 may be made of the previously described materials for conductive element 42.

In an embodiment, light-emitting components 16 correspond to light-emitting diodes. Each light-emitting diode 16 may comprise a stack comprising successively a N-type semiconductor layer resting on substrate 66 and preferably in contact with substrate 66, an active area, and a P-type semiconductor layer, conductive element 66 being in contact with P-type semiconductor layer. In an embodiment, substrate 66 comprises a layer in contact with light-emitting diodes 16 which is made of the same material as the N-type layer of light-emitting diodes 16. In an embodiment, semiconductor layers of light-emitting diodes 16 are formed by epitaxy steps on substrate 66.

Figure 7:
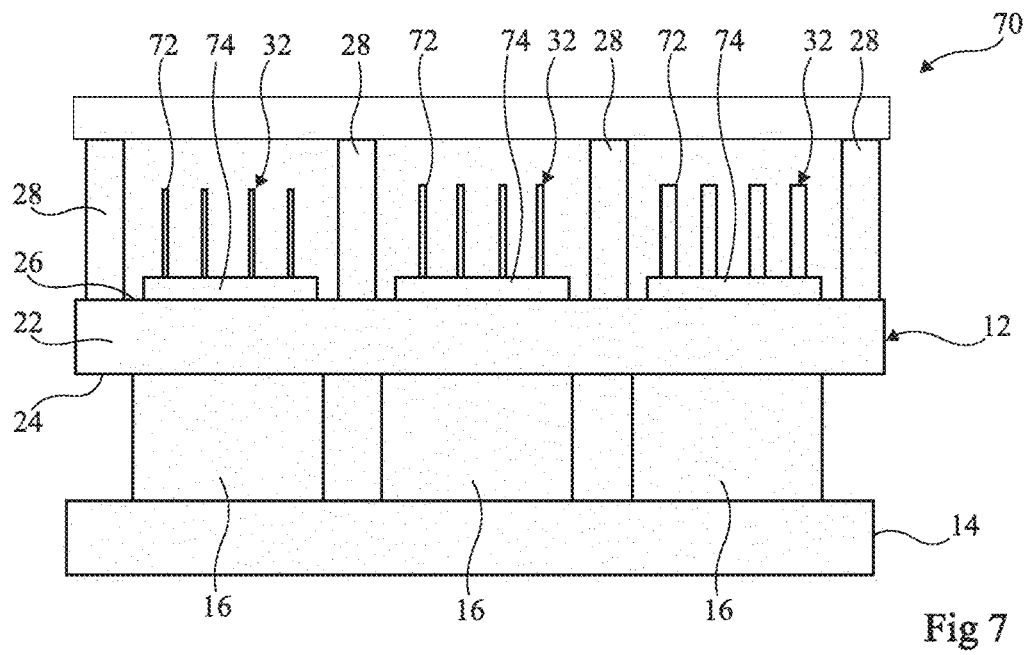

FIG. 7 is a partial simplified cross-section view of an embodiment of an optoelectronic device 70 comprising light-emitting components 16. Optoelectronic device 70 comprises the same elements as optoelectronic device 10 shown in FIG. 1, each photoluminescent block 32 comprising photoluminescent nanowires or microwires 72. For each photoluminescent block 32, the nanowires or microwires 72 are formed on a transparent substrate 74 and pick and placed to their pre-defined slots in the cavity enclosed by walls 28. Each wire 72 may have the same structure as the structures previously disclosed for photoluminescent blocks 32. This embodiment may be advantageous in terms of higher IQE achievable for green and red nanowires compared to a planar structure on photoluminescent blocks 32.

In another embodiment, nanowires or microwires 72 are formed directly on face 26 of substrate 22, preferentially using growth method at low temperature, for example molecular-beam epitaxy (MBE), hydride vapor phase epitaxy (HVPE) or metal-organic chemical vapor deposition (MOCVD). Each wire 72 may have the same structure as the structures previously disclosed for photoluminescent blocks 32. In another embodiment, each wire 72 may comprise a core having an elongated form and covered by a shell comprising a stack of semiconductor layers, the shell covering the lateral faces and the top face of the core or covering only the top face of the core.

Figure 8:
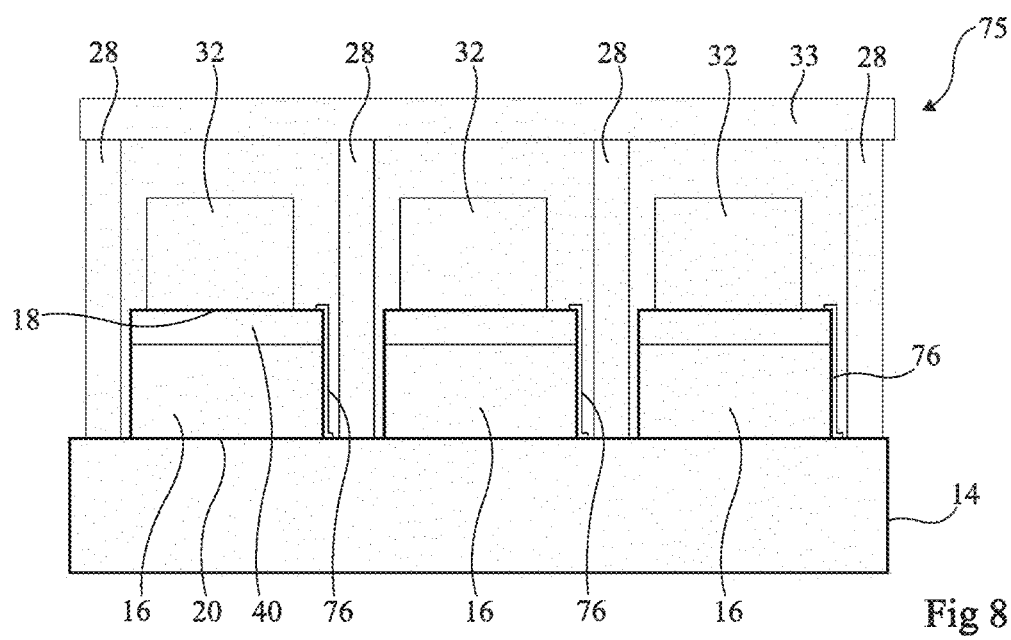

FIG. 8 is a partial simplified cross-section view of an embodiment of an optoelectronic device 75 comprising light-emitting components 16. Optoelectronic device 75 comprises the same elements as optoelectronic device 10 shown in FIG. 1 with the difference that photoluminescent blocks 32 directly rest on light-emitting components 16 and in that walls 28 rest on control circuit 14 and surround both light-emitting components 16 and photoluminescent blocks 32. Optoelectronic device 75 further comprises, for each light-emitting component 16, an electrically conductive element 76 running along the lateral side of light-emitting component 16, in contact with control circuit 14 and with face 18 of light-emitting component 16 and electrically insulated from the lateral side of light-emitting component 16 by an electrically insulating layer not shown. Conductive elements 76 may be made of the previously described materials for conductive elements 42. In an embodiment, light-emitting components 16 correspond to light-emitting diodes having the structure disclosed in FIG. 3, N-type semiconductor layer 40 being shown on FIG. 7. Photoluminescent blocks 32 can be attached to semiconductor layer 40 through bonding with an optically transparent medium. In another embodiment, light-emitting components 16 correspond to vertical-cavity surface-emitting laser, or VCSEL.

FIGS. 9A to 9F are partial simplified cross-section views of the structures obtained at successive steps of an embodiment of a method of manufacturing optoelectronic device 10 shown in FIG. 1 in which the light-emitting components 16 have the structure shown in FIG. 3.

Figure 9A:
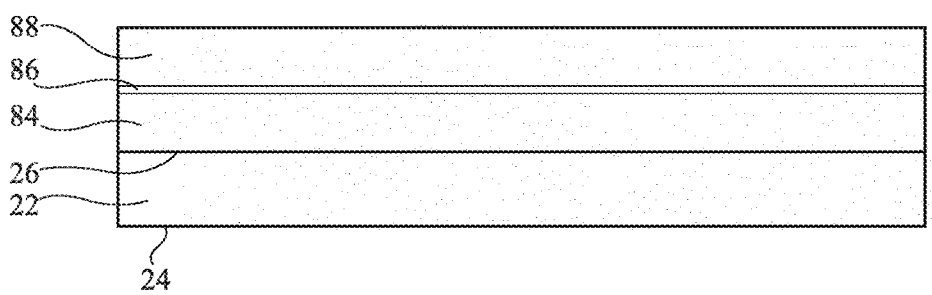
FIGS. 9A to 9F are partial simplified cross-section views of the structures obtained at successive steps of an embodiment of a method of manufacturing the optoelectronic device shown in FIG. 1.

FIG. 9A shows the structure obtained after the steps of:
providing substrate 22;
forming doped semiconductor layer 84 of a first conductivity type, for example, N-type doped on face 24 of substrate 22;
forming active area 86 on layer 84; and
forming, on active area 86, doped semiconductor layer of a second conductivity type opposite to the first conductivity type, for example, P-type doped.

Layer 84 is made of the same material as layer 40. Active area 86 has the same structure as active area 38. Layer 88 is made of the same material as layer 36. Layer 84, active area 86 and layer 88 may be grown by a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), hydride vapor phase epitaxy (HVPE) may be used, as well as an atomic layer deposition (ALD). Further, electrochemical processes may be used, for example, chemical bath deposition (CBD), hydrothermal processes, liquid aerosol pyrolysis, or electrodeposition. In an embodiment, layer 84 is linked to substrate 22 by an epitaxial relationship, first formed layer of active area 86 is linked to layer 84 by an epitaxial relationship and layer 88 is linked to last formed layer of active area 86 by an epitaxial relationship.

Figure 9B:
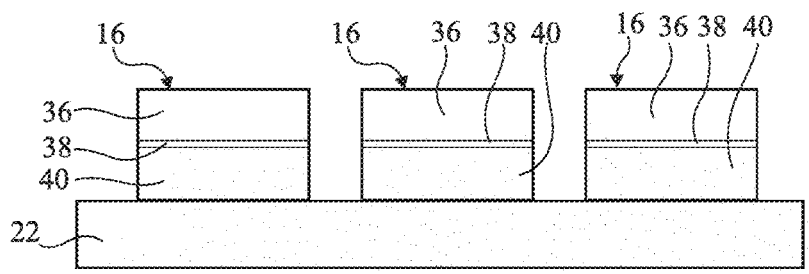

FIG. 9B shows the structure obtained after having separated light-emitting diodes 16. This may be done by etching trenches through layer 88, active area 86 and layer 84 up to substrate 22 to delimit, for each light-emitting diode 16, layer 36, active area 38 and layer 40. This etching is stopped on substrate 22 or in substrate 22. In another embodiment, the etching is stopped on layer 84 or partially through layer 84 to obtain the structure shown in FIG. 4. The implemented etching may be a dry etching, for example via a plasma based on $Cl_2$ or a reactive ion etching (RIE).

Figure 9C:
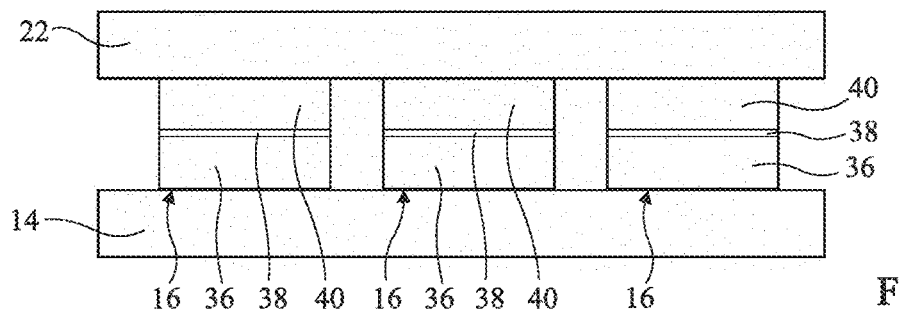

FIG. 9C shows the structure obtained after having bonded control chip 14 to light-emitting diodes 16 on layers 36 at the opposite side of substrate 22. The bonding of control chip 14 to light-emitting diodes 16 may be performed with use of inserts such as connection microbeads, not shown. Alternatively, the bonding of control chip 14 to light-emitting diodes 16 may be performed by direct bonding, with no use of inserts. The direct bonding may comprise a direct metal-to-metal bonding of metal areas of light-emitting diodes 16 and of metal areas of control chip 14 and a dielectric-to-dielectric bonding of the dielectric areas at the surface of light-emitting diodes 16 and of the dielectric areas at the surface of control chip 14. The bonding of control chip 14 to light-emitting diodes 16 may be performed by a thermocompression method where light-emitting diodes 16 are placed against control chip 14, with a pressure and a heating being applied.

Figure 9D:
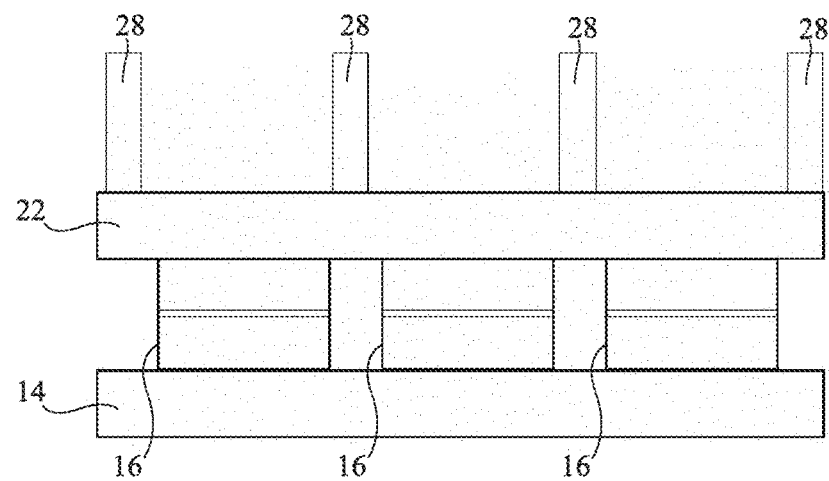

FIG. 9D shows the structure obtained after having formed walls 28 on substrate 22. Walls 28 may be made by electroplating or lift-off techniques.

Figure 9E:
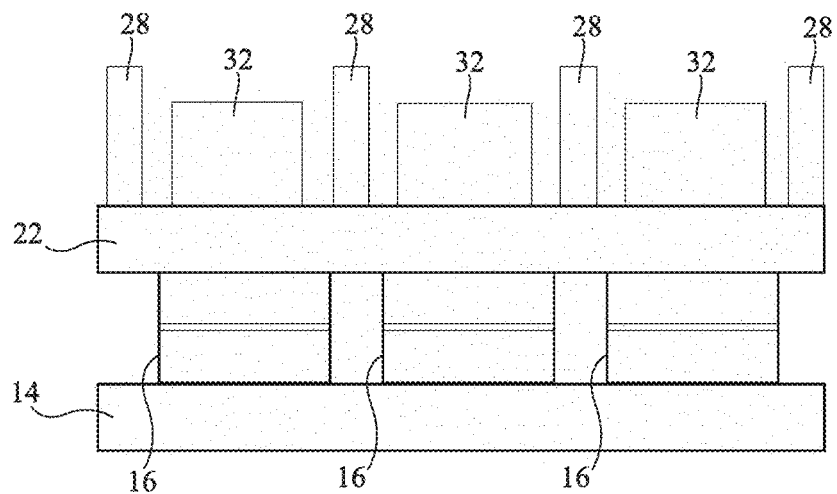

FIG. 9E shows the structure obtained after having pick and placed the first, second and third photoluminescent blocks 32 onto their pre-defined slots on substrate 22. Substrate 22 can be thinned down to ensure minimal crosstalk between sub-pixels. Substrate 22 is substantially transparent to the radiation emitted by light-emitting diodes 16. In another embodiment, substrate 22 is withdrawn before the bounding step and photoluminescent blocks 32 are placed directly on the light-emitting diodes 16.

Photoluminescent blocks 32 are made independently from the steps disclosed in relation to FIGS. 9A-9D. The layers forming each photoluminescent block 32 may be grown by a method such as CVD, MOCVD, MBE, GSMBE, MOMBE, PAMBE, ALE, HVPE or ALD. Further, electrochemical processes may be used, for example, CBD, hydrothermal processes, liquid aerosol pyrolysis, or electro-deposition.

In an embodiment, the layers of first photoluminescent blocks 32 destined to emit radiations at the second wavelength, are grown on a substrate and then etched to delimit first photoluminescent blocks 32. The first photoluminescent blocks of the second wavelength are then pick and placed onto pre-defined cavity sections surrounded by walls 28. The layers of second photoluminescent blocks 32 destined to emit radiations at the third wavelength are grown on a substrate and then etched to delimit second photoluminescent blocks 32. The second photoluminescent blocks of the third wavelength are then pick and placed onto the pre-defined cavity sections surrounded by walls 28. The same operations are repeated for third photoluminescent blocks 32 destined to emit radiations at the fourth wavelength.

Figure 9F:
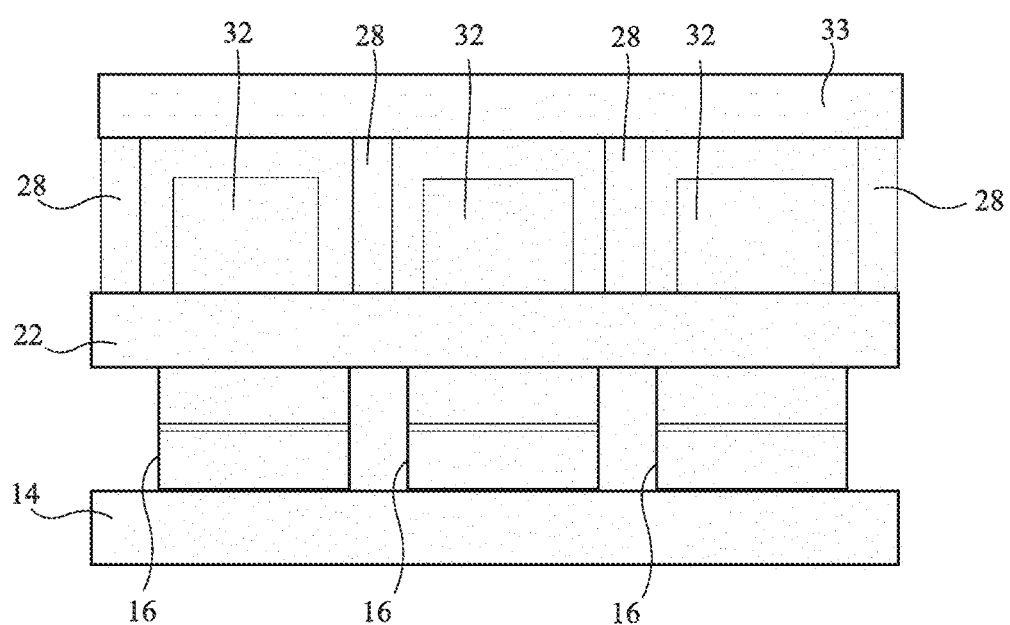

FIG. 9F shows the structure obtained after having placed the non-patterned filter 33 over the walls 28 to cover all the photoluminescent blocks 32.

Specific embodiments have been described. Various alterations and modifications will occur to those skilled in the art. In particular, although in the previously-described embodiments, walls 28 have lateral faces that are substantially orthogonal to face 26, lateral faces of walls 28 may be profiled, for example inclined with respect to face 26.

Moreover, several embodiments with various alterations have been described. Some elements of these embodiments and alterations can be combined. As an example, light-emitting components 16 of optoelectronic devices 65, 70 and 75 may have the structure previously described in relation to FIG. 3 or 4.

The invention claimed is:

1. An optoelectronic device comprising:
 a first substrate comprising opposite first and second surfaces;
 light-emitting components in contact with the first surface, each light-emitting component being adapted to emit a first radiation at a first wavelength, the first substrate being transparent to the first radiation;
 photoluminescent blocks in contact with the second surface, each photoluminescent block facing at least one light-emitting component and comprising photoluminescent nanowires or microwires each comprising a single quantum well or multiple quantum wells, photoluminescent blocks being divided into first photoluminescent blocks adapted to convert by optical pumping the first radiation into a second radiation at a second wavelength, second photoluminescent blocks adapted to convert by optical pumping the first radiation into a third radiation at a third wavelength and third photoluminescent blocks adapted to convert by optical pumping the first radiation into a fourth radiation at a fourth wavelength;
 for each photoluminescent block, a second substrate transparent to the first radiation and in contact with the second surface of the first substrate, the nanowires or microwires of the photoluminescent block being formed on the second substrate; and
 walls on the second surface, said walls delimiting openings, said openings being opposite to the light-emitting components, each opening comprising at least one of the photoluminescent blocks.

2. The optoelectronic device of claim 1, wherein said walls are at least partially made of a reflecting material at least for the second, third and fourth radiations.

3. The optoelectronic device of claim 1, further comprising a full sheet non-patterned filter covering the photoluminescent blocks on the side of the photoluminescent blocks opposite to the light-emitting components and adapted to block the first radiation and to give way to the second, third and fourth radiations.

4. The optoelectronic device of claim 1, wherein the light-emitting components comprise light-emitting diodes.

5. The optoelectronic device of claim 1, wherein the light-emitting components comprise vertical-cavity surface-emitting lasers.

6. The optoelectronic device of claim 1, wherein the first wavelength is in the range from 350 nm to 430 nm, wherein the second wavelength is in the range from 440 nm to 490 nm, wherein the third wavelength is in the range from 510 nm to 570 nm and wherein the fourth wavelength is in a range from 600 nm to 720 nm.

7. The optoelectronic device of claim 1, wherein the photoluminescent blocks further comprise fourth photoluminescent blocks adapted to convert by optical pumping the first radiation into a fifth radiation at a fifth wavelength.

8. The optoelectronic device of claim 7, wherein the fifth wavelength is in the range from 570 nm to 600 nm.

9. The optoelectronic device of claim 1, wherein the photoluminescent blocks are bounded to the light-emitting components by a bonding medium transparent to the first radiation.

10. The optoelectronic device of claim 9, wherein the walls surround the light-emitting components.

11. A method of manufacturing an optoelectronic device of claim 1, comprising the steps of:
 a) providing the first substrate;
 b) forming the light-emitting components on the first substrate;
 c) forming the photoluminescent blocks on the second substrate using photoluminescent nanowires or microwires each comprising a single quantum well or multiple quantum wells; and
 d) picking and placing the photoluminescent blocks in the openings and binding the photoluminescent blocks to the light-emitting components.

12. The method of claim 11, further comprising the step of:
 e) forming a full-sheet non patterned filter above the photoluminescent blocks adapted to block the first radiation.

13. The optoelectronic device of claim 10, wherein said walls are at least partially made of a reflecting material at least for the second, third and fourth radiations.

14. The optoelectronic device of claim 1, wherein the nanowires or microwires of each photoluminescent block are arranged in slots in a cavity enclosed by the walls.

15. The optoelectronic device of claim 1, wherein the nanowires or microwires of each photoluminescent block are formed directly on a face of the second substrate.

16. The optoelectronic device of claim 1, wherein the height of photoluminescent blocks is less than the height of the walls.

17. The optoelectronic device of claim 1, further comprising a filter disposed over the walls and adapted to block the first radiation and to give way to the second, third and fourth radiations.

18. The optoelectronic device of claim 17, wherein the filter comprises a non-patterned filter.

* * * * *